(12) United States Patent
Chang (10) Patent No.: US 12,243,942 B2
(45) Date of Patent: Mar. 4, 2025

(54) VERTICAL OXIDE-SEMICONDUCTOR TRANSISTOR AND METHOD OF MANUFACTURING THE SAME

(71) Applicant: Powerchip Semiconductor Manufacturing Corporation, Hsinchu (TW)

(72) Inventor: Wen-Yueh Chang, Hsinchu (TW)

(73) Assignee: Powerchip Semiconductor Manufacturing Corporation, Hsinchu (TW)

(*) Notice: Subject to any disclaimer, the term of this patent is extended or adjusted under 35 U.S.C. 154(b) by 457 days.

(21) Appl. No.: 17/839,474

(22) Filed: Jun. 13, 2022

(65) Prior Publication Data

US 2023/0361218 A1    Nov. 9, 2023

(30) Foreign Application Priority Data

May 5, 2022   (TW) .................................. 111116914

(51) Int. Cl.
*H01L 29/786*   (2006.01)
*H01L 29/66*   (2006.01)

(52) U.S. Cl.
CPC ...... *H01L 29/7869* (2013.01); *H01L 29/6656* (2013.01); *H01L 29/66742* (2013.01)

(58) Field of Classification Search
CPC ............ H01L 29/7869; H01L 29/6656; H01L 29/66742; H01L 29/42392; H01L 29/78642; H01L 29/7827; H01L 29/401; H01L 29/42356; H01L 29/66969
See application file for complete search history.

(56) References Cited

U.S. PATENT DOCUMENTS

| | | | |
|---|---|---|---|
| 8,890,119 B2* | 11/2014 | Doyle | H01L 29/66431 257/24 |
| 8,896,056 B2* | 11/2014 | Masuoka | H01L 29/7827 257/329 |
| 2002/0195652 A1* | 12/2002 | Maeda | H01L 27/1203 257/329 |
| 2011/0253981 A1* | 10/2011 | Rooyackers | H01L 29/66356 977/840 |
| 2016/0233343 A1* | 8/2016 | Miyairi | H01L 29/78696 |
| 2018/0047849 A1* | 2/2018 | Liu | H01L 27/088 |
| 2019/0229204 A1* | 7/2019 | Reznicek | H01L 21/2254 |

* cited by examiner

*Primary Examiner* — Dao H Nguyen
(74) *Attorney, Agent, or Firm* — Winston Hsu (57) ABSTRACT

A vertical oxide-semiconductor transistor is proposed by the present invention, including an insulating substrate, a source in the insulating substrate, a gate on the insulating substrate, wherein the gate surrounds the source and forms a recess on the source, an inner spacer on an inner sidewall of the gate in the recess, an oxide-semiconductor layer on the inner spacer and the source and directly contacts the source, a filling oxide on the oxide-semiconductor layer and filling in the recess, and a drain on the oxide-semiconductor layer and filling oxide and directly connecting with the oxide-semiconductor layer, wherein the drain completely covers the source and partially overlaps the gate.

10 Claims, 6 Drawing Sheets

VERTICAL OXIDE-SEMICONDUCTOR TRANSISTOR AND METHOD OF MANUFACTURING THE SAME

BACKGROUND OF THE INVENTION

1. Field of the Invention

The present invention relates generally to an oxide-semiconductor transistor, and more specifically, to a vertical oxide-semiconductor transistor.

2. Description of the Prior Art

Oxide-semiconductor is a kind of compound semiconductor material made of metal and oxygen. In comparison to conventional semiconductor materials like silicon (Si), germanium (Ge) or gallium arsenide (GaAs), the structure of oxide-semiconductor is usually ionic crystal with larger band gap, better transparency as well as more complicated chemical property. The amount of dopant and oxygen vacancy in the oxide-semiconductor would affect its carrier concentration, thus it may become a conductor if the carrier concentration therein is high enough, and similarly, with different conductive types like n-type and p-type. Since oxide-semiconductor is provided with the properties of transparency, relatively high carrier mobility, lower process temperature and high uniformity in large scale, it is widely regarded as a promising candidate to replace low temperature poly-silicon (LTPS) as a material for channel layer in thin-film transistor (TFT), especially for currently well-received amorphous indium gallium zinc oxide (IGZO) material, which may be properly applied in flexible display panel or high-resolution large-scale display panel.

With the advent of Metaverse, there is an increasing demand for micro display device in the market. This kind of display device requires extremely high resolution to achieve a real immersive experience comparable to naked eyes' visual perception. However, no matter what kind of the display device is, its pixel density is inevitably limited by the size of adopted driver transistors, even using oxide-semiconductor transistor is no exception. The area of currently available horizontal oxide-semiconductor transistor is still too large for the aforementioned high-end display application and unable to meet its requirements. In addition, in the aspect of operation, large-scale or high resolution display device also means it requires TFTs with higher response speed. Therefore, how to reduce the loading capacitance of TFT in order to achieve faster response speed also becomes an urgent topic for those of skilled in the art committed to research and develop.

SUMMARY OF THE INVENTION

In the light of the demand of current market for high-end display device, the present invention hereby provides a novel oxide-semiconductor transistor, featuring the vertical channel design that may significantly reduce the area and size of transistors. Furthermore, in comparison to other vertical transistor designs, the gate design of present invention produces smaller overlapping area between gate and source or drain, which may significantly reduce Miller capacitance (between input and output) and increase response speed.

One aspect of present invention is to provide a vertical oxide-semiconductor transistor, including an insulating substrate, a source in the insulating substrate, a gate on the insulating substrate, wherein the gate surrounds the source and forms a recess on the source, an inner spacer on an inner sidewall of the gate in the recess, an oxide-semiconductor layer on the inner spacer and the source and directly contacting the source, a filling oxide on the oxide-semiconductor layer and filling in the recess, and a drain on the oxide-semiconductor layer and the filling oxide and directly contacting the oxide-semiconductor layer, wherein the drain completely overlaps the source and partially overlaps the gate.

Another aspect of present invention is to provide a method of manufacturing a vertical oxide-semiconductor transistor, including steps of providing an insulating substrate, forming a source in said insulating substrate, forming a gate surrounding said source on said insulating substrate, wherein said gate forms a recess on said source, forming a spacer on a sidewall of said gate, forming an oxide-semiconductor layer on said spacer and said source in said recess, and said oxide-semiconductor layer directly contacts said source, forming a filling oxide on said oxide-semiconductor layer and filling in said recess, and forming a drain on said oxide-semiconductor layer and said filling oxide, and said drain directly contacts said oxide-semiconductor layer, wherein said drain completely covers said source and partially overlaps said gate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention.

Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature's relationship to another element(s) or feature(s) as illustrated in the figures.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or heterogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
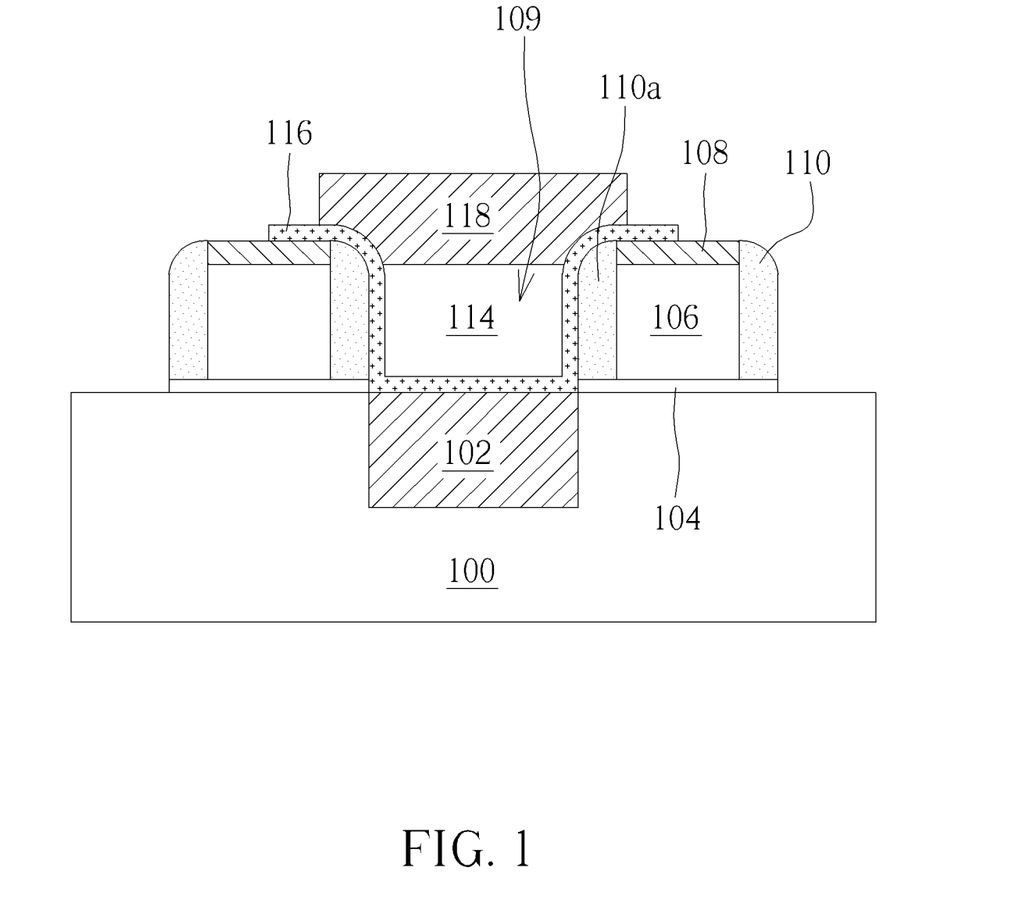
FIG. 1 is a schematic cross-section of a vertical oxide-semiconductor transistor in accordance with one preferred embodiment of the present invention.

First, please refer to FIG. 1, which is a schematic cross-section of a vertical oxide-semiconductor transistor in accordance with one preferred embodiment of the present invention. As shown in FIG. 1, the vertical oxide-semiconductor transistor of present invention includes generally the components like an insulating substrate 100, a source 102, a gate 106, an oxide-semiconductor layer 116 and a drain 118. In the embodiment of present invention, the insulating substrate 100 serves as a base for setting the components of transistor in the present invention. The insulating substrate 100 may be a plastic substrate made of polyimide (PI), polycarbonate (PC), polyethylene naphthalate (PEN) or polyethylene terephthalate (PET), which may provide good insulating property and flexibility suitable for the application of flexible display device. In other embodiment, the insulating substrate 100 may also be the glass substrate without flexibility or silicon oxide ($SiO_2$) substrate. In the embodiment of present invention, source 102 is buried in the insulating substrate 100 and exposed from the insulating substrate 100, whose exposed surface may be flush with surrounding insulating substrate 100. The material of source 102 may be low-resistance metal material like titanium (Ti), molybdenum (Mo), chromium (Cr), aluminum (Al), gold (Au), tungsten (W) or alloy thereof.

Refer still to FIG. 1. In the embodiment of present invention, gate 106 is set on the insulating substrate 100 and surrounds the source 102 (as shown in FIG. 3B), thereby defining a recess 109 on the source 102. An insulating layer 104, such as a silicon oxide ($SiO_2$) layer, is formed between the gate 106 and the insulating substrate 100 to improve insulating property for the layer structures to be formed on the insulating substrate 100 in later processes. A hard mask layer 108 is further formed on the gate 106, with a material of silicon nitride to function as a hard mask in the gate patterning process. In the embodiment of present invention, gate 106 doesn't contact source 102. The two components do not overlap each other in vertical direction and with a spacer 110 intervening therebetween. The material of spacer 110 may be insulating material like silicon oxide, silicon nitride or aluminum oxide ($Al_2O_3$). Spacers 110 may be formed both on the inner sidewall and outer sidewall of the gate 106, wherein the inner spacer 110a in the recess 109 functions as a gate insulating layer in the present invention, and preferably, it partially overlaps the source 102 in vertical direction and with sufficient thickness to inhibit current leakage and improve margin voltage for the transistor.

Refer still to FIG. 1. A conformal oxide-semiconductor layer 116 is formed along the surface of entire recess 109. In the embodiment of present invention, the oxide-semiconductor layer 116 directly contacts the source 102 at bottom of the recess 109 and extends upwardly along the inner spacer 110a in the recess 109 to the outside of the recess 109 and covers on parts of the hard mask layer 108. That is, the oxide-semiconductor layer 116 partially overlaps the gate 106 in vertical direction. The material of oxide-semiconductor layer 116 may include oxide-semiconductor material like titanium oxide ($TiO_2$), zinc oxide (ZnO), niobium pentoxide ($Nb_2O_5$), tungsten oxide ($WO_3$), Tin (IV) oxide ($SnO_2$), zirconium dioxide ($ZrO_2$) or indium gallium zinc oxide (IGZO). The oxide-semiconductor layer 116 is provided with a resistance property similar to semiconductor material, thus it may serve as a channel layer for the transistor. In addition, since its width of band gap is larger than the energy of most visible light, it is also provided with transparency property and suitable for the thin-film transistor (TFT) in transparent display. A filling oxide 114 with a material like silicon oxide is filled in the remaining space of recess 109. In the embodiment of present invention, the top surface of filling oxide 114 is preferably lower than the top surface of hard mask layer 108 or gate 106, thus it may achieve self-alignment effect between the gate 106 and the drain 118 to be formed in later processes.

Refer still to FIG. 1. In the embodiment of present invention, drain 118 is formed on the filling oxide 114 and completely covers the source 102 below. The material of drain 118 may be low-resistance metal material like titanium (Ti), molybdenum (Mo), chromium (Cr), aluminum (Al), gold (Au) or alloy thereof. In the embodiment of present invention, drain 118 also extends toward the surrounding gate 106 and directly contacts the surrounding oxide-semiconductor layer 116, and it may overlap parts of the gate 106 and hard mask layer 108 in vertical direction. In this way, the oxide-semiconductor layer 116 on the inner sidewall 110a functions as a channel of the transistor in present invention to connect the source 102 and the drain 118 and control the switch thereof through the surrounding gate 106, which is a design of vertical oxide-semiconductor transistor. The channel length of this transistor is determined by the height of gate 106. In comparison to conventional horizontal channel layer design, this design may significantly reduce required layout area for the transistor. Furthermore, in comparison to prior art, the overlapping area of the gate 106 and the source 102 or drain 118 is very small in the transistor of present invention, thereby significantly reducing the loading capacitance between the gate and the source/drain of TFT, to achieve faster transistor switching speed.

The process flow of manufacturing the vertical oxide-semiconductor transistor of the present invention will now be described in following preferred embodiment with reference to the schematic cross-sections of FIG. 2A, FIG. 3A, FIG. 4A, FIG. 5A and FIG. 6A. FIG. 2B, FIG. 3B, FIG. 4B, FIG. 5B and FIG. 6B may be referred collectively to fully understand the plan layout in the manufacturing process of the transistor, wherein those cross-sections are taken along the section line A-A' in the corresponding plan views.

Figure 2A:
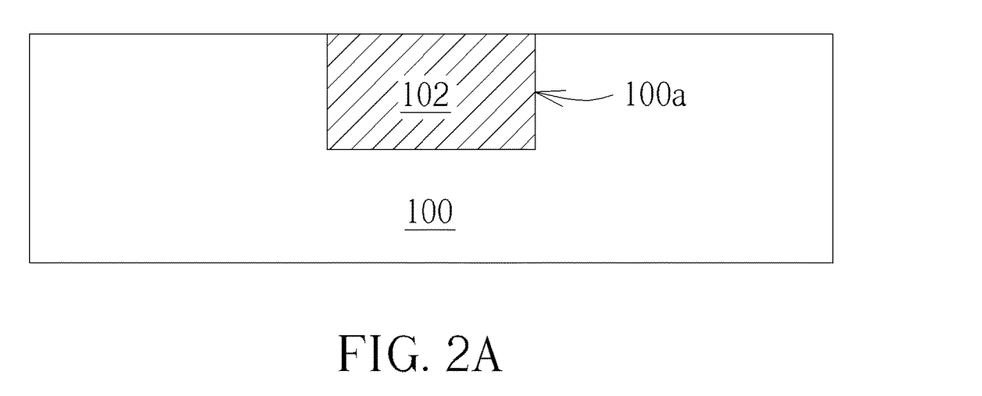
FIG. 2A, FIG. 3A, FIG. 4A, FIG. 5A and FIG. 6A are schematic cross-sections illustrating a process flow of manufacturing the vertical oxide-semiconductor transistor in accordance with one preferred embodiment of the present invention.
Figure 2B:
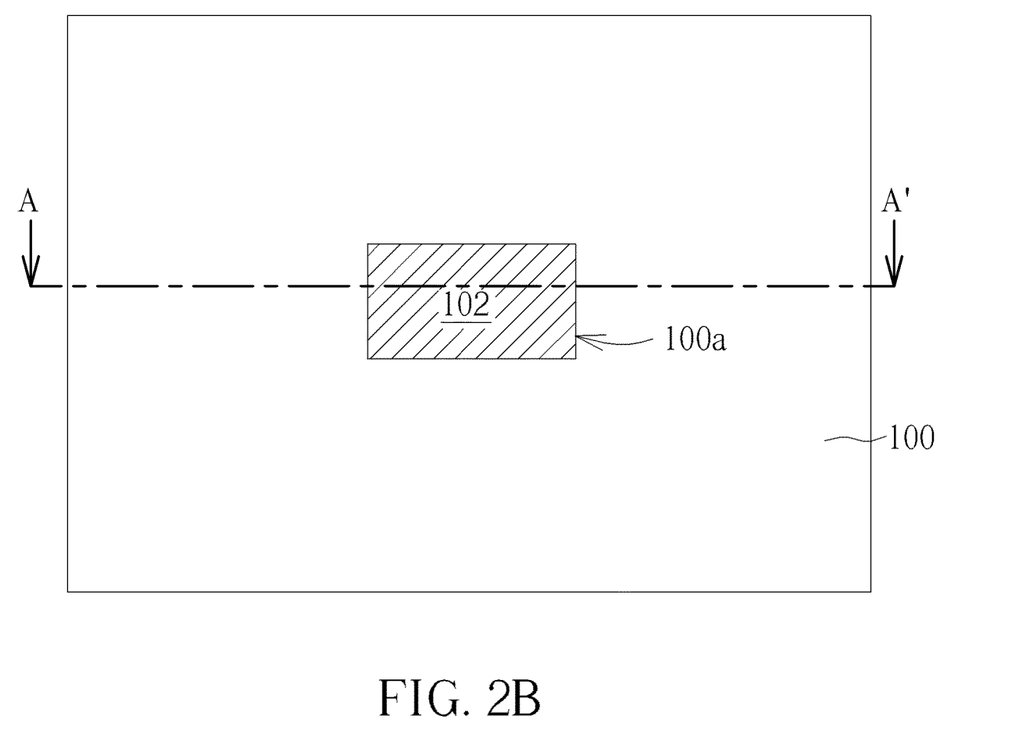
FIG. 2B, FIG. 3B, FIG. 4B, FIG. 5B and FIG. 6B are schematic plan views illustrating the process flow of manufacturing the vertical oxide-semiconductor transistor in accordance with one preferred embodiment of the present invention.

First, please refer to FIG. 2A and FIG. 2B. Provide an insulating substrate 100 as a base for setting the components of transistor of the present invention, with material like a plastic substrate made of polyimide (PI), polycarbonate (PC), polyethylene naphthalate (PEN), polyethylene terephthalate (PET) or a silicon oxide substrate. Thereafter, a patterning process is performed on the insulating substrate 100 to form a recess 100a on the insulating substrate 100. This patterning process may be a photolithography and etching process. After the recess 100a is formed, a source 102 is then formed in the recess 100a. In the embodiment of present invention, the material of source 102 may be low-resistance metal material like titanium (Ti), molybdenum (Mo), chromium (Cr), aluminum (Al), gold (Au), tungsten (W) or alloy thereof, which may be formed on the recess 100a and insulating substrate 100 through chemical mechanical deposition (CVD), physical mechanical deposition (PVD) or sputter deposition process. A planarization process (ex. CMP process) is then performed to remove parts of the source material, so that the exposed surface of source 102 may be flush with the surface of surrounding insulating substrate 100.

Figure 3A:
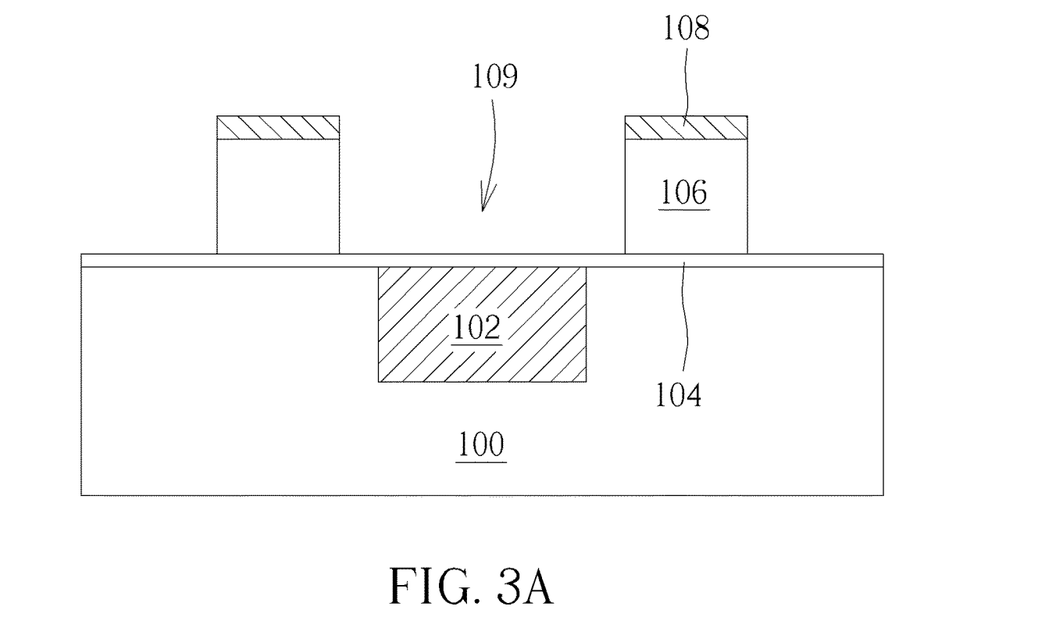
Figure 3B:
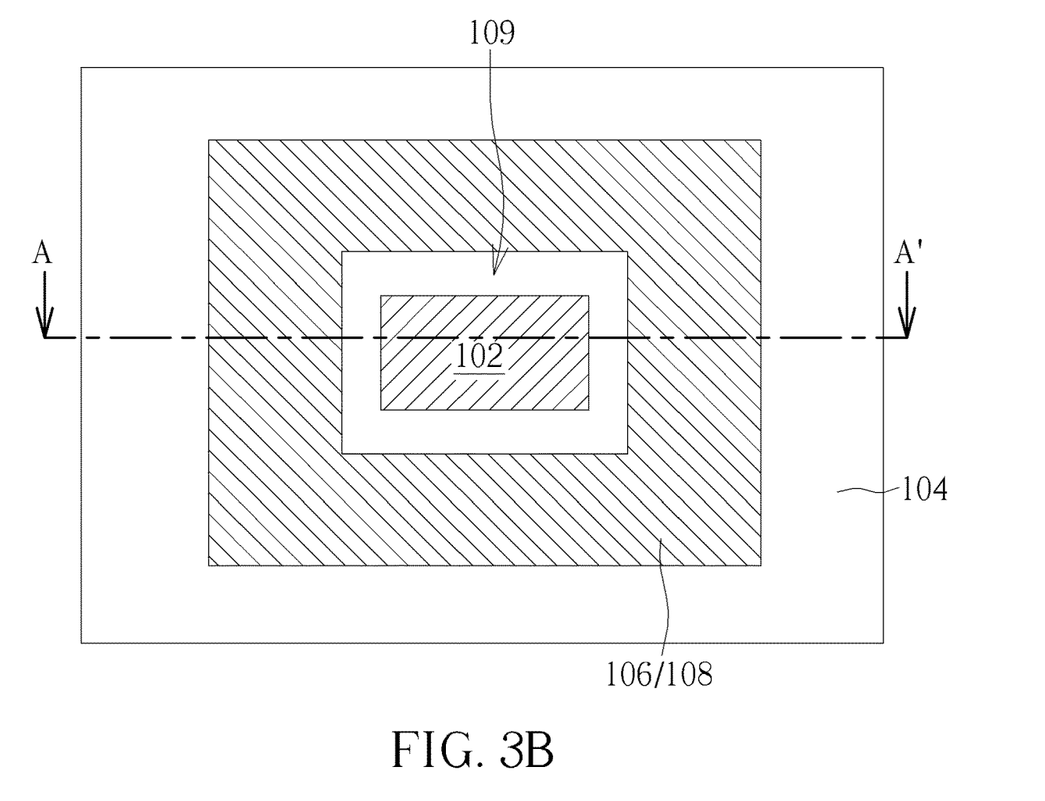

Please refer to FIG. 3A and FIG. 3B. After the source 102 is formed, a thin insulating layer 104, such as a silicon oxide layer, may be formed on the surface of insulating substrate 100 through PECVD process, to improve insulating property for the layer structures to be formed on the insulating substrate 100 in later processes. Thereafter, a gate 106 is formed on the insulating layer 104. Steps of manufacturing the gate 106 may include: forming a gate material layer and a hard mask material layer sequentially on the insulating layer 104. A photolithography process is then performed to pattern the hard mask material layer, thereby forming a hard mask layer 108 with gate pattern. As the plan view shown in FIG. 3B, the gate pattern surrounds the source 102 but doesn't contact it. The two components are spaced apart by a spacing. An etching process is then performed using the hard mask layer 108 as an etching mask to pattern the gate material layer below, so as to form the gate 106 surrounding the source 102, and the patterned gate 106 defines a recess 109 on the source 102. In the embodiment of present invention, the material of gate 106 may be low-resistance metal material like titanium (Ti), molybdenum (Mo), chromium (Cr), aluminum (Al), gold (Au) or alloy thereof, which may be formed through PVD process or sputter deposition process. The material of hard mask layer 108 may be silicon nitride, which may be formed through PECVD process.

Figure 4A:
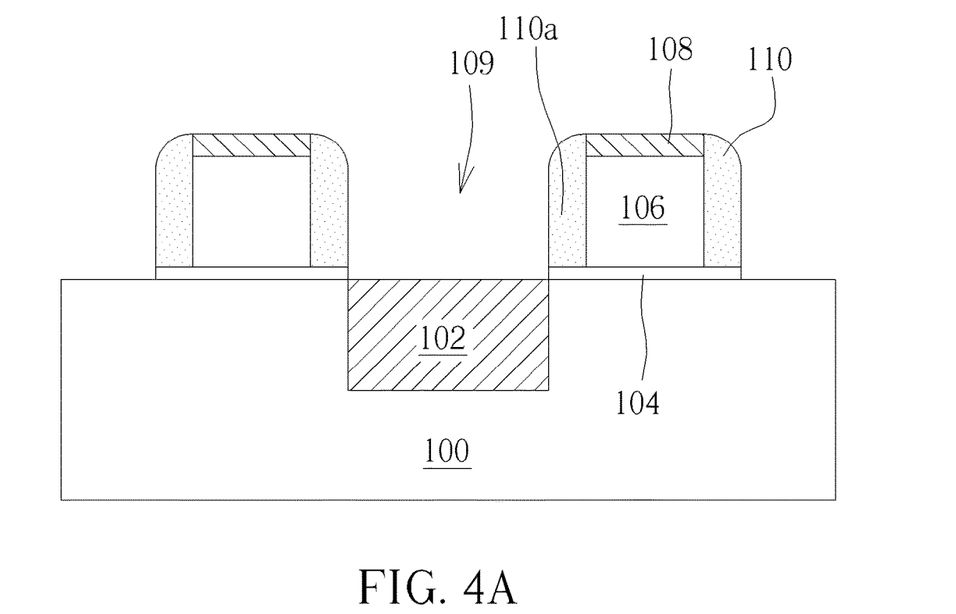
Figure 4B:
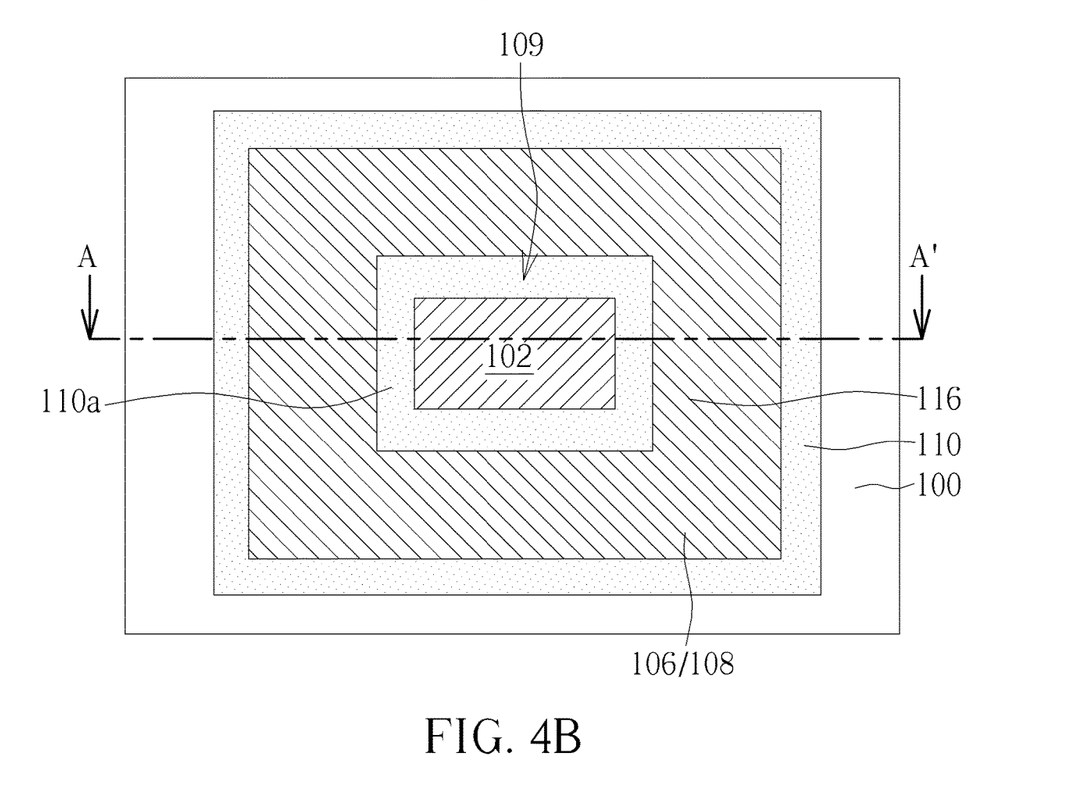

Please refer to FIG. 4A and FIG. 4B. After the gate 106 is formed, spacer 110 is formed on the sidewall of gate 106. Steps of manufacturing the spacer 110 may include: forming a conformal spacer layer first on the gate 106 and insulating layer 104. An anisotropic etching process is then performed to remove the spacer layer of a predetermined thickness, so as to form the spacer 110 on the sidewall of gate 106 and expose the hard mask layer 108 on the gate 106. Please note that the insulating layer 104 not covered by the gate 106 and spacer 110 is also removed in this etching process, so that the source 102 buried in the insulating substrate 100 is exposed, and the inner spacer 110a formed in the recess 109 preferably overlaps the source 102 in vertical direction. In the embodiment of present invention, the material of spacer 110 may be insulating material like silicon oxide, silicon nitride or aluminum oxide, which may be formed through CVD process.

Figure 5A:
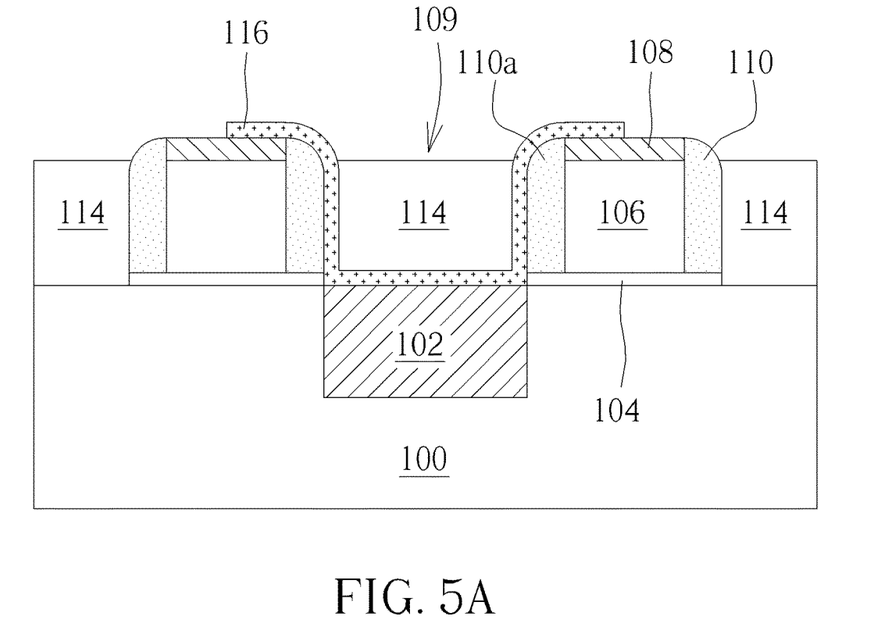
Figure 5B:
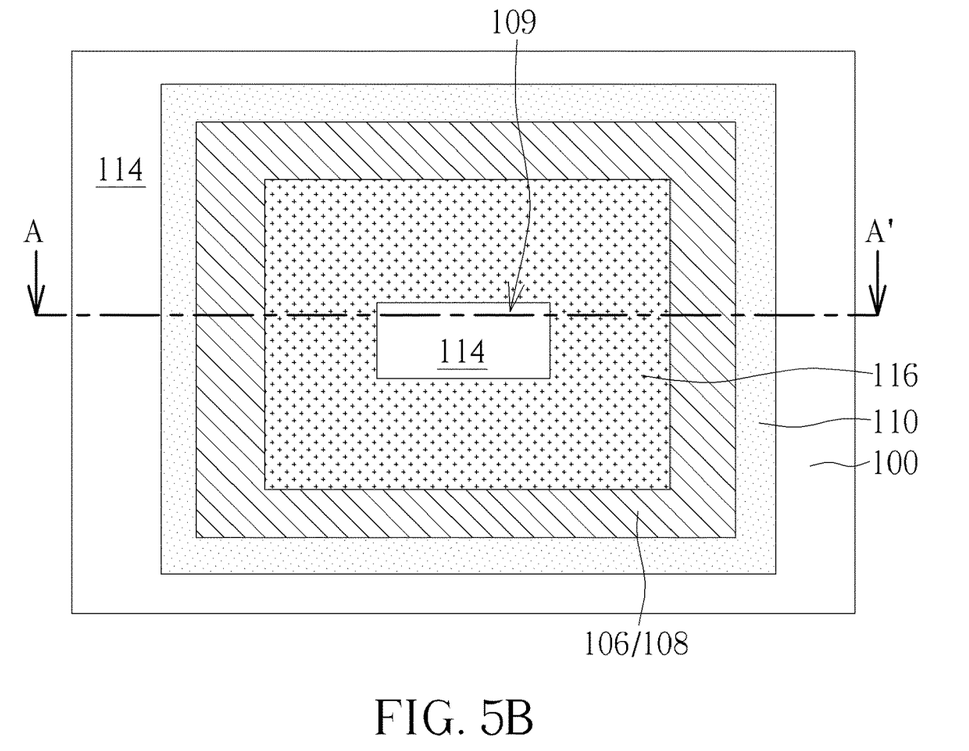

Please refer to FIG. 5A and FIG. 5B. After the spacer 110 is formed, an oxide-semiconductor layer 116 is then formed on the inner spacer 110a and source 102. Steps of forming oxide-semiconductor layer 116 may include: forming a conformal oxide-semiconductor material layer on the surfaces of hard mask layer 108, spacer 110, source 102 and the insulating substrate 100. A photolithography process is then performed to remove the oxide-semiconductor material layer outside the recess 109 and remain only the oxide-semiconductor material layer on the source 102, the inner spacer 110a and parts of the hard mask layer 108. As shown in the figure, the oxide-semiconductor layer 116 would directly contact the source 102 at bottom of the recess 109 and extend upwardly along the inner spacer 110a to cover on parts of the hard mask layer 108. That is, the oxide-semiconductor layer 116 partially overlaps the gate 106 in vertical direction. The material of oxide-semiconductor layer 116 may include titanium oxide ($TiO_2$), zinc oxide (ZnO), niobium pentoxide ($Nb_2O_5$), tungsten oxide ($WO_3$), Tin (IV) oxide ($SnO_2$), zirconium dioxide ($ZrO_2$) or indium gallium zinc oxide (IGZO), which may be formed by sputter deposition or atomic layer deposition (ALD) process.

Refer still to FIG. 5A and FIG. 5B. After the oxide-semiconductor layer 116 is formed, a filling oxide 114 is filled in the remaining space of recess 109. The material of filling oxide 114 may be silicon oxide, which may be formed through CVD process, and a planarization process (ex. CMP process) is then performed to remove the filling oxide 114 outside the recess 109. In the embodiment of present invention, an etchback process may be further performed to remove parts of the filling oxide 114, so that its top surface may be lower than the top surface of hard mask layer 108 or gate 106, thus it may achieve self-alignment effect between the gate 106 and drain 118 in later steps of forming drain 118.

Figure 6A:
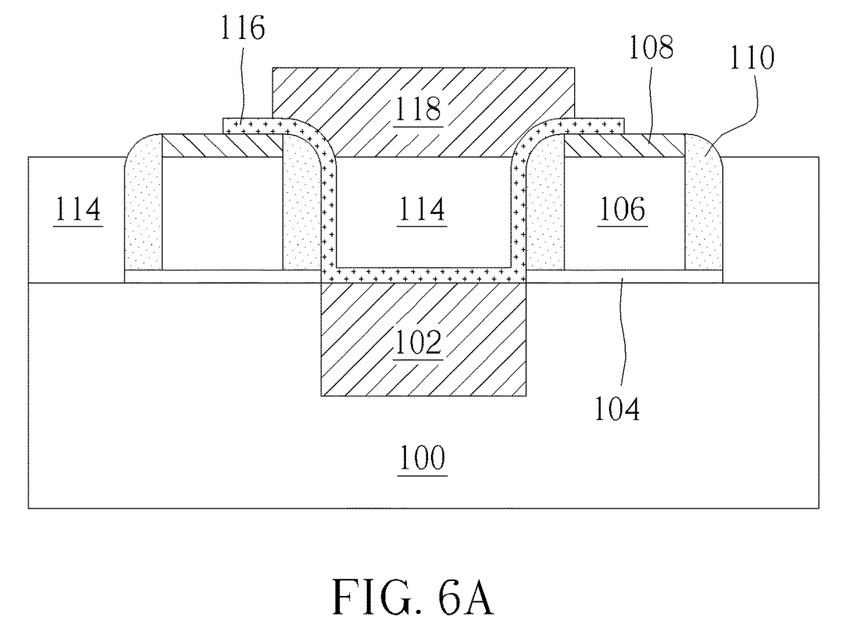
Figure 6B:
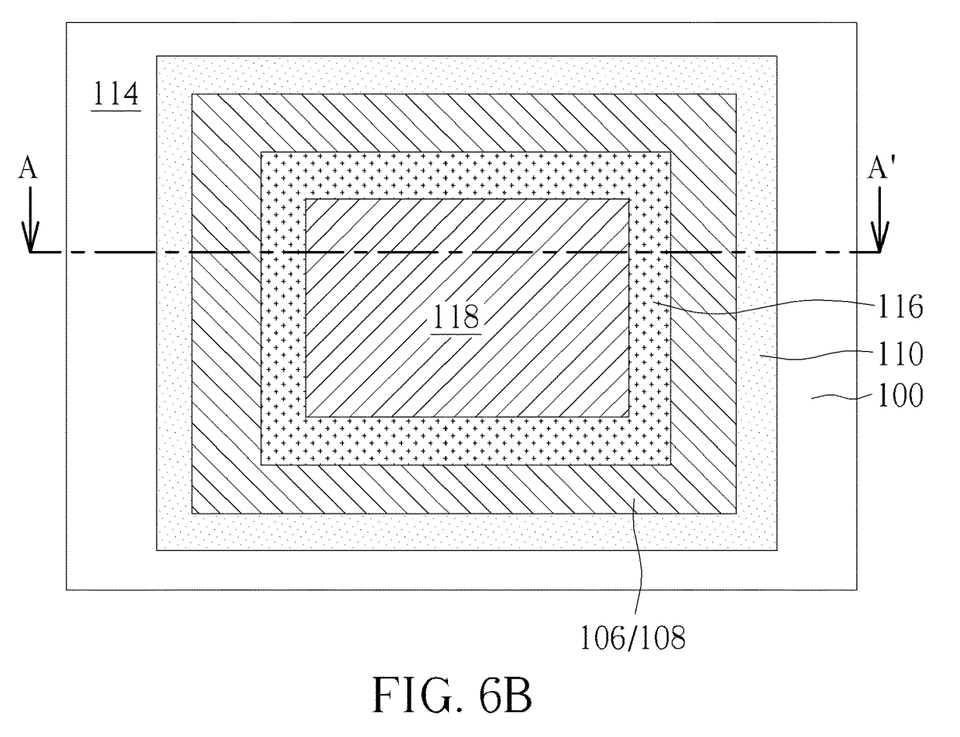

Lastly, please refer to FIG. 6A and FIG. 6B. After the oxide-semiconductor layer 116 and the filling oxide 114 are formed, a drain 118 is then formed on the oxide-semiconductor layer 116 and filling oxide 114. The material of drain 118 may be low-resistance metal material like titanium (Ti), molybdenum (Mo), chromium (Cr), aluminum (Al), gold (Au) or alloy thereof, which may be formed through PVD process or sputter deposition process, and may be patterned through photolithography process to make it completely cover the source 102 below and extends toward the surrounding gate 106 and directly contacts the surrounding oxide-semiconductor layer 116. Therefore, the manufacture of vertical oxide-semiconductor transistor of present invention is completed.

In conclusion to the aforementioned embodiments of the oxide-semiconductor transistor provided by the present invention, the vertical channel design not only significantly reduces required layout area for the transistor, but also achieves the self-alignment effect between the gate and the source/drain, while the oxide-semiconductor layer functioned as the channel layer in the process. At the same time, in comparison to other vertical transistor designs, the overlapping area of the gate and the source or drain in this design of the present invention is very small, which may significantly reduce Miller capacitance of the transistor (between input and output) and increase the response speed of transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A vertical oxide-semiconductor transistor, comprising:
   an insulating substrate;
   a source in said insulating substrate;
   a gate on said insulating substrate, wherein said gate surrounds said source and forms a recess on said source;
   an inner spacer on an inner sidewall of said gate in said recess;
   an oxide-semiconductor layer on said inner spacer and said source and directly contacting said source;
   a filling oxide on said oxide-semiconductor layer and filling in said recess; and
   a drain on said oxide-semiconductor layer and said filling oxide and directly contacting said oxide-semiconductor layer, wherein said drain completely covers said source and partially overlaps said gate.

2. The vertical oxide-semiconductor transistor of claim 1, further comprising a hard mask layer on said gate, a part of said oxide-semiconductor layer extends onto said hard mask layer along said inner spacer.

3. The vertical oxide-semiconductor transistor of claim 1, wherein said source overlaps said inner spacer.

4. The vertical oxide-semiconductor transistor of claim 1, wherein said source doesn't overlap said gate.

5. The vertical oxide-semiconductor transistor of claim 1, further comprising an insulating layer between said gate and said insulating substrate.

6. The vertical oxide-semiconductor transistor of claim 1, wherein a material of said oxide-semiconductor layer comprises titanium oxide ($TiO_2$), zinc oxide (ZnO), niobium pentoxide ($Nb_2O_5$), tungsten oxide ($WO_3$), Tin(IV) oxide ($SnO_2$), zirconium dioxide ($ZrO_2$) or indium gallium zinc oxide (IGZO).

7. The vertical oxide-semiconductor transistor of claim 1, wherein a material of said gate, said source and said drain comprises titanium (Ti), molybdenum (Mo), chromium (Cr), aluminum (Al), gold (Au), tungsten (W) or alloy thereof.

8. The vertical oxide-semiconductor transistor of claim 1, wherein a material of said inner spacer comprises silicon oxide ($SiO_2$), silicon nitride ($SiN_x$) or aluminum oxide ($Al_2O_3$).

9. The vertical oxide-semiconductor transistor of claim 1, wherein a material of said insulating substrate is polyimide (PI), polyethylene naphthalate (PEN), polyethylene terephthalate (PET) or silicon oxide ($SiO_2$).

10. The vertical oxide-semiconductor transistor of claim 1, wherein a material of said filling oxide is silicon oxide ($SiO_2$).

* * * * *